United States Patent [19]

McGee

[11] Patent Number: 4,933,636
[45] Date of Patent: Jun. 12, 1990

[54] SELF-ALIGNING TACHOMETER AND METHOD OF MANUFACTURING SAME

[75] Inventor: Jeffrey S. McGee, San Diego, Calif.

[73] Assignee: Cipher Data Products, Inc., San Diego, Calif.

[21] Appl. No.: 314,979

[22] Filed: Feb. 24, 1989

[51] Int. Cl.⁵ ............................ G01D 5/34; H01S 4/00; G01P 3/36

[52] U.S. Cl. .............................. 324/175; 250/231.13; 29/592.1

[58] Field of Search ................ 324/175, 226, 207, 208, 324/262; 250/231 SE; 29/592.1, 595

[56] References Cited

U.S. PATENT DOCUMENTS

| | | | |
|---|---|---|---|
| 4,184,071 | 1/1980 | Fryer et al. | 250/231 SE |
| 4,593,269 | 6/1986 | Nakamura et al. | 250/231 SE |
| 4,727,356 | 2/1988 | Abe et al. | 250/231 SE |

Primary Examiner—Reinhard J. Eisenzopf
Assistant Examiner—Walter E. Snow
Attorney, Agent, or Firm—Baker, Maxham, Jester & Meador

[57] ABSTRACT

A tachometer assembly includes a precision manufactured hub assembly or member having a cylindrical hub and a backing plate for mounting on a shaft of a drive motor, a fine line disc having a plurality of radial reference lines circumferentially disposed about an outer periphery thereof, a hub bore formed in the disc concentric with the reference lines and sized to fit the cylindrical hub within two thousandths of an inch, and a circular spring retainer having a central bore with internal teeth for press fitting on the cylindrical hub and an annular rim for biasing the disc into support engagement with the backing plate.

15 Claims, 3 Drawing Sheets

SELF-ALIGNING TACHOMETER AND METHOD OF MANUFACTURING SAME

BACKGROUND OF THE INVENTION

The present invention relates to tachometers for use in tape drives and the like and pertains particularly to an improved tachometer and method of manufacturing the same.

Tape drives are widely used as data storage devices for computers. It is essential when using tape drives for storage that the blocks of data be readily accessible. It is therefore important to determine precisely how much tape has been fed from one reel to another. The speed of the tape and its tension must also be precisely controlled.

Various tachometers have been used to determine the position of the tape, and to control its speed and tension. One widely used tachometer and drive assembly 10 is illustrated in FIG. 1 of the drawings. This assembly comprises a drive motor 12 having a drive shaft 14 on which a tachometer disc 16 is mounted. The tachometer disc is mounted on the shaft of the drive motor and passes between spaced emitter-detector pairs, which are connected in a quadrature arrangement in a sensing unit 18 to detect the direction and speed of the motor shaft. The disc 16 has a plurality of radially extending markings or slots 20 that are sensed by the emitter-detector pairs in the sensing unit 18. The disc is mounted between a first hub 22, which is mounted on the shaft 14, and a second disc or hub 24. The disc is constructed from thin copper shim stock (2 mil.) with the plurality of radial marking slots formed by etching. A center hole is then formed in the disc for mounting on the hub.

In accordance with the conventional construction, encoder disc 16 is manually mounted on the first hub 22, and is centered by the assembler observing it under a microscope while rotating and tapping the edge of the disc to precisely center it. Once the disc is centered, it is fixed in place between the hubs 22 and 24 by means of a drop of glue or other adhesive.

This process of assembly not only takes time but results in a fairly high percentage of rejects. Presently, assembly by this process takes from twenty to forty minutes, and the reject rate is frequently as high as forty percent.

The centering of the encoder disc is highly critical because inaccuracy in the centering can result in imprecise resolution of the markings. For example, with reference to FIG. 2, the spaced apart photo cells 1 and 2 are positioned so that a pair of spaced markings are out of phase precisely ninety degrees. This enables the sensing unit 18 to establish the direction and speed of rotation of the disc. Should the disc be out of radial or concentric alignment by as much as a few thousandths of an inch, the markings on the encoder disc will not be properly phased and the sensing unit generates inaccurate position data.

In addition, the encoder disc must be accurately centered vertically between the emitter-detector pairs. For example, the running gap between the disc and one side of each pair must be on the order of 0.001 to 0.005. Should the gap become greater than this, then the shadows of the encoded lines generate confusing signals. Also, should the gap become too small and rubbing occur between the disc and the sensing unit, the slot markings may become filled with debris, resulting in a failure of a sensed signal.

The present invention was devised to overcome the above problems of the prior art.

SUMMARY AND OBJECTS OF THE INVENTION

It is the primary object of the present invention to provide an improved tachometer.

Another object of the invention is to provide an improved method of manufacturing tachometers.

In accordance with a primary aspect of the present invention, a tachometer comprises a precision hub member for mounting on a drive motor shaft, a precision manufactured disc fitted to the hub member, and a spring retainer press fitted to the hub member for retaining the disc on the hub.

BRIEF DESCRIPTION OF THE DRAWING

The above and other objects and advantages of the present invention will become apparent from the following description when read in conjunction with the accompanying drawings wherein.

DETAILED DESCRIPTION OF THE PREFERRED EMBODIMENTS

Figure 1:
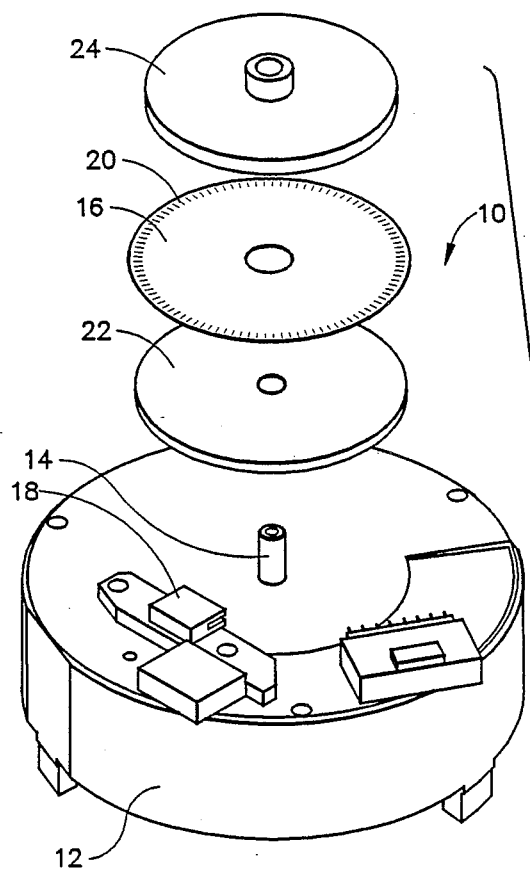
FIG. 1 is an exploded perspective view illustrating the prior art tachometer construction.
Figure 2:
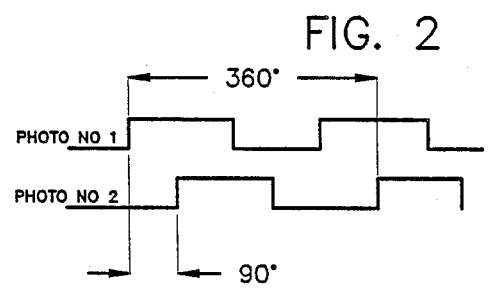
FIG. 2 is a wave form diagram illustrating the signals from the emitter-detector pairs.
Figure 3:
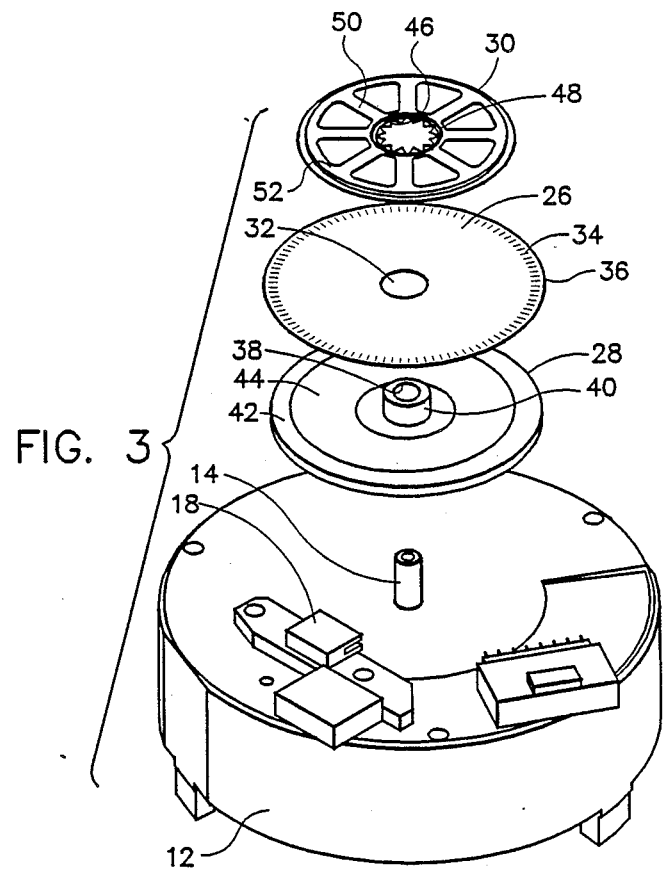
FIG. 3 is an exploded perspective view of an exemplary embodiment of the present invention.

Referring to FIG. 3 of the drawings, wherein like elements are identified by the same reference numerals, a tachometer in accordance with the present invention is positioned for attachment to the drive shaft 14 of motor 12. As shown in FIG. 3, a fine line disc 26 is positioned for mounting on a hub assembly or member 28, which is to be mounted on the shaft 14. A spring retainer 30 is positioned for mounting on the hub or shoulder 40 for retaining the disc 26 in place on the hub member.

Figure 4:
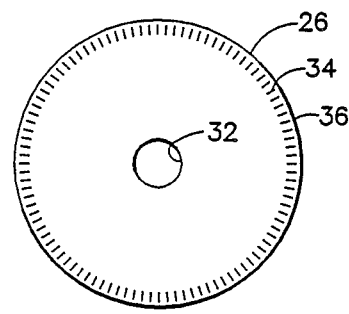
FIG. 4 is a top plan view of an encoder disc.

The encoder disc 26 (FIG. 4), in accordance with the invention, is preferably constructed of a suitable thin material, such as a copper or copper alloy sheet of approximately 2 mil. in thickness and having a suitable protective coating, such as nickel or the like applied thereto. The encoder disc is formed by a process of etching, which simultaneously forms a central bore 32 and a plurality of radially extending, circumferentially spaced slots 34. It may also simultaneously form the outer peripheral edge or diameter 36 of the disc. It will be understood that the disc may be made with opaque and transparent sectors in lieu of slots. The term "reference lines" as used herein includes both slots, opaque/reflective sectors, and other equivalents.

In the preferred process, the disc 26 is formed to a very high degree of accuracy by a process of photo etching, wherein a first image of the disc is formed by a photo process at a size of approximately ten times the final dimension. The first photo print is made highly accurate and is then reduced to its desired size. As the image of the disc is reduced, any inaccuracies in the formation thereof are similarly reduced. The proper size image is applied to a photo resist convering on a sheet of disc material, which forms a highly accurate imprint of the disc on the photo resist. The photo resist is then exposed, e.g. to UV light and processed to expose unwanted areas of the disc blank. The copper sheet is then appropriately acid etched to accurately form the disc.

The etching process forms the disc and the radial slots to a very highly accurate degree, and such that the internal bore 32 is sized to within less than two-thousandths of an inch of the size of the hub 40 on which it is mounted. The bore is concentric within the diameter of the radial slots 34 to a similar accuracy.

The hub member 28 on which the disc is mounted is formed of a suitable material, such as aluminum by casting for example, and then machining to a high degree of accuracy. The aluminum hub is formed with its central hub or shoulder 40 having a central bore 38, which is slightly undersized to shaft 14 for press fitting thereon. The sizing is preferably of such accuracy that press fitting results in little or no distortion of the hub and its integral backing plate. The hub has an outer cylindrical surface to which the internal bore 32 of the disc 26 is to match within an accuracy of two-thousandths of an inch. A backing plate integral with the hub member includes or defines an annular support surface 42 (FIG. 5), which is machined to a similar high degree of accuracy for engagement and support of the disc at a position just inward of and closely adjacent the radial slots 34. A recess portion 44 provides for the support surface 42 to stand out for annular support of the disc 26.

A retainer spring clamp 30 (FIG. 3) comprises a circular clamp member in the form as illustrated having a central tooth or star bore 46 within a surrounding hub 48, which is connected by radial spokes 50 to an annular rim 52. The star bore 46 is formed of a plurality of inwardly directed teeth which engage and grip the outer cylindrical surface of the hub 40. These teeth are forced to bend axially outward at the tip to grip and resist removal from the outer surface of the hub 40.

Figure 5:
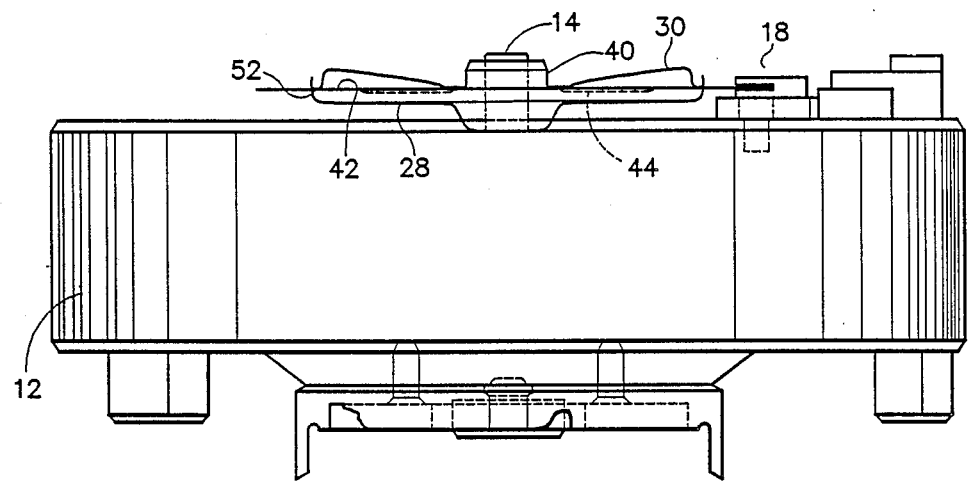
FIG. 5 is an enlarged side elevation view of the assembled embodiment of FIG. 3.

As illustrated in FIG. 5, the annular rim 52 presses against the encoder disc 26 in an area corresponding to the circular or annular surface 42 of the hub member 28, biasing the encoder disc thereagainst. The teeth of the star bore 46 are formed such that the central bore defined thereby is slightly undersized. Accordingly, the teeth, when pressed about the cylindrical hub 40, retain the spring clamp 30 in place.

Figure 7:
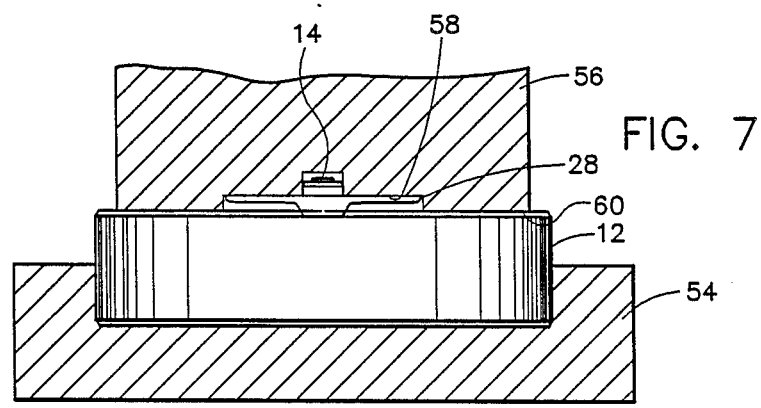
FIG. 7 is a side part elevation and part section view illustrating a step in the process of assembly according to the present invention.

In the assembly operation, the hub member 28 is first pressed onto the end of the motor shaft 14 as illustrated in FIG. 7. The motor 12 is supported on a jig or support structure 54. An air or fluid pressure actuated ram presses a suitably configured tool 56 into position to press the hub member 28 onto the motor shaft. The press tool 56 is suitably shaped and machined such that a surface 58 engages surface 42 of the hub member and forces the hub member 28 onto shaft 14. As tool surface 60 engages the upper surface of the motor 12, the hub member is vertically positioned on the shaft 14 within plus or minus one-thousandth of an inch. This properly places the encoder disc, when supported on the backing surface 42, at the appropriate height of the running gap within the sensing unit 18.

Figure 6:
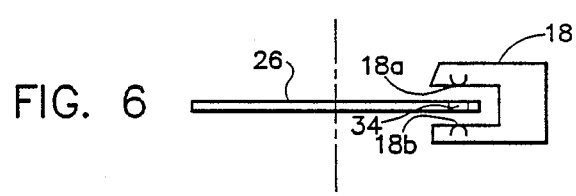
FIG. 6 is an enlarged side elevation detail view of a portion of the encoder disc and sensor of FIG. 3.

With this arrangement, precision assembly of the encoder disc on the hub member is accomplished by simply placing the disc with its edge in the gap of sensing unit 18 and its bore 32 over the hub 40. The close fit of bore 32 to hub 40 precisely locates the disc with respect to its rotary axis. The vertical location of backing plate surface 42 precisely locates the disc axially within the gap of the sensing unit 18, as illustrated in FIG. 6. The retainer spring clamp 30 is then placed into position over the disc and pressed down, with the teeth of the central star bore gripping the outer surface of the hub 40. This is accomplished by hand assembly and within a matter of seconds, with a very high degree of accuracy. This assembly results in the disc 26 being accurately positioned within the gap of sensor 18, with the slots 34 accurately positioned and aligned between emitter 18a and detector 18b of each of the pairs in the sensing unit 18, as shown in FIG. 6. A suitable running gap is also achieved.

In test runs, in accordance with the present invention, rejects have amounted to on the order of about five percent. Therefore, this approach provides ninety-five percent acceptable production of manufactured units.

While I have illustrated and described my invention by way of specific embodiments, it is to be understood that numerous changes and modifications may be made therein without departing from the spirit and scope of the invention as defined in the appended claims.

I claim:

1. A tachometer assembly comprising:
   a precision manufactured hub member including a central hub and a surrounding backing plate for mounting on a shaft of a drive motor;
   a disc made of copper of about 2 mil. in thickness having a plurality of radially extending and circumferentially spaced reference lines disposed along an outer periphery thereof and a hub bore formed therein concentric with said reference lines and sized to fit said hub within two thousandths of an inch; and
   a spring retainer for press fitting on said hub for biasing said disc into support engagement with said backing plate.

2. A tachometer assembly according to claim 1 wherein:
   said hub is formed of aluminum.

3. A tachometer assembly according to claim 1 wherein:
   said disc has a Nickel coating.

4. A tachometer assembly according to claim 1 wherein:
   said spring retainer has a central bore defined by a plurality of inwardly directed teeth and an annular rim with a plurality of spokes connecting said rim to said teeth.

5. A tachometer assembly according to claim 1 wherein:
   said reference lines are radial slots.

6. A tachometer assembly according to claim 1 wherein:
   said central hub and backing plate are of a unitary construction formed of aluminum.

7. A tachometer assembly comprising:
   a precision manufactured hub member including a central hub and a surrounding backing plate for mounting on a shaft of a drive motor;
   a disc having a plurality of radially extending and circumferentially spaced reference lines disposed along an outer periphery thereof, a hub bore formed therein concentric with said reference lines and sized to fit said hub within two thousandths of an inch, and wherein said disc is formed by a process of etching simultaneously forming said reference lines and said hub bore; and a spring retainer for press fitting on said hub for biasing said disc into support engagement with said backing plate.

8. A tachometer assembly comprising:

a precision manufactured hub member including a central hub and a surrounding backing plate for mounting on a shaft of a drive motor, said central hub and backing plate are of a unitary construction formed of aluminum;

a disc having a plurality of radially extending and circumferentially spaced reference lines disposed along an outer periphery thereof, a hub bore formed therein concentric with said reference lines and sized to fit said hub within two thousandths of an inch, and wherein said disc is made of copper of about 2 mil. in thickness and has a Nickel coating; and a spring retainer for press fitting on said hub for biasing said disc into support engagement with said backing plate.

9. A tachometer assembly according to claim 8 wherein:

said reference lines are radial slots; and said disc is formed by a process of etching simultaneously forming said reference lines and said hub bore.

10. A tachometer assembly according to claim 9 wherein:

said spring retainer has a central hub portion with a plurality of inwardly directed teeth and an annular rim with a plurality of spokes connecting said rim to said hub portion.

11. A tachometer assembly comprising in combination:

a precision manufactured hub assembly having a cylindrical hub and backing plate for mounting on a shaft of a drive motor said cylindrical hub and backing plate are of unitary construction formed of aluminum;

a fine line disc having a plurality of radial reference lines circumferentially disposed about an outer periphery thereof a hub bore formed therein concentric with said reference lines and sized to fit said hub within two thousandths of an inch, wherein said disc is made of copper of about 2 mil. in thickness and wherein said hub bore and said reference lines are formed simultaneously by a process of etching; and a circular spring retainer having a central bore with internal teeth for press fitting on said cylindrical hub and an annular rim for biasing said disc into support engagement with said backing plate.

12. A method of manufacturing a self-aligning tachometer comprising the steps of:

selecting a combination press-on hub and backing plate assembly for mounting on the shaft of a drive motor, said assembly having a cylindrical hub extension;

selecting a disc having radially directed reference lines around the outer periphery thereof, a central bore concentric with said reference lines and sized to fit said cylindrical hub extension within two thousandths of an inch, wherein the step of selecting said disc includes forming said disc by means of an etching process;

mounting said disc about an outer surface of said hub extension; and selecting and mounting a spring retainer on said hub assembly for retaining said disc on said hub assembly and biasing said disc against said backing plate.

13. A method according to claim 12 wherein:

said step of forming said disc includes simultaneously forming said reference lines and said bore by said etching process.

14. A method according to claim 13 wherein:

the step of selecting said hub and backing plate assembly includes forming said hub extension and backing plate of a unitary construction by means of a machining process.

15. A method according to claim 14 wherein:

the step of selecting said spring retainer includes selecting said retainer to have a central hub with a bore having internal teeth for gripping said cylindrical extension of said press-on hub, an annular rim and a plurality of radial spokes connecting said central hub to said rim.

* * * * *